(12) United States Patent
Liu (10) Patent No.: US 10,128,127 B2
(45) Date of Patent: Nov. 13, 2018

(54) THIN-FILM TRANSISTOR SUBSTRATE MANUFACTURING METHOD AND THIN-FILM TRANSISTOR SUBSTRATE MANUFACTURED WITH SAME

(71) Applicant: Shenzhen China Star Optoelectronics Technology Co., Ltd., Shenzhen (CN)

(72) Inventor: Yang Liu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/823,488

(22) Filed: Nov. 27, 2017

(65) Prior Publication Data

US 2018/0082856 A1 Mar. 22, 2018

Related U.S. Application Data

(62) Division of application No. 14/917,567, filed on Mar. 8, 2016, now Pat. No. 9,881,811.

(30) Foreign Application Priority Data

Oct. 13, 2015 (CN) .......................... 2015 1 0659395

(51) Int. Cl.
*H01L 21/44* (2006.01)
*H01L 21/02* (2006.01)
(Continued)

(52) U.S. Cl.
CPC ........ *H01L 21/44* (2013.01); *H01L 21/02244* (2013.01); *H01L 21/02554* (2013.01);
(Continued)

(58) Field of Classification Search
CPC ............... H01L 21/44; H01L 21/02244; H01L 21/02554; H01L 21/02565; H01L 21/02631; H01L 27/1218; H01L 27/1225; H01L 29/66969; H01L 29/78603; H01L 29/7869

See application file for complete search history.

(56) References Cited

U.S. PATENT DOCUMENTS

2012/0119216 A1* 5/2012 Ohmi ................ H01L 21/02178
257/59
2013/0043469 A1* 2/2013 Kawamura ....... H01L 29/78618
257/43
(Continued)

*Primary Examiner* — Yosef Gebreyesus
(74) *Attorney, Agent, or Firm* — Leong C. Lei (57) ABSTRACT

A thin-film transistor (TFT) substrate includes a backing plate, a gate electrode formed on the backing plate, a gate insulation layer formed on the gate electrode and the backing plate, an active layer formed on the gate insulation layer, a source electrode and a drain electrode formed on the active layer and the gate insulation layer, a passivation layer formed on the source electrode, the drain electrode, the active layer, and the gate insulation layer, and a pixel electrode formed on the passivation layer. The gate insulation layer is formed of a material that is an oxide of a material that makes the gate electrode. The passivation layer is formed of a material that is an oxide of a material that makes the source electrode and the drain electrode.

19 Claims, 5 Drawing Sheets

(51) Int. Cl.
- *H01L 27/12* (2006.01)
- *H01L 29/66* (2006.01)
- *H01L 29/786* (2006.01)
- *H01L 29/49* (2006.01)
- *H01L 21/28* (2006.01)

(52) U.S. Cl.
CPC .. *H01L 21/02565* (2013.01); *H01L 21/02631* (2013.01); *H01L 27/1218* (2013.01); *H01L 29/4908* (2013.01); *H01L 29/66969* (2013.01); *H01L 29/7869* (2013.01); *H01L 29/78603* (2013.01); *H01L 21/28229* (2013.01); *H01L 27/1225* (2013.01)

(56) References Cited

U.S. PATENT DOCUMENTS

| | | | |
|---|---|---|---|
| 2014/0071364 A1* | 3/2014 | Liu | G02F 1/1362 349/43 |
| 2014/0312315 A1* | 10/2014 | Kang | H01L 29/7869 257/40 |

\* cited by examiner

THIN-FILM TRANSISTOR SUBSTRATE MANUFACTURING METHOD AND THIN-FILM TRANSISTOR SUBSTRATE MANUFACTURED WITH SAME

CROSS REFERENCE TO RELATED APPLICATIONS

This is a divisional application of co-pending U.S. patent application Ser. No. 14/917,567, filed on Mar. 8, 2016, which is a national stage of PCT Application No. PCT/CN2015/099273, filed on Dec. 28, 2015, claiming foreign priority of Chinese Patent Application No. 201510659395.0, filed on Oct. 13, 2015.

BACKGROUND OF THE INVENTION

1. Field of the Invention

The present invention relates to the field of display technology, and in particular to a thin-film transistor (TFT) manufacturing method and a TFT manufactured with the method.

2. The Related Arts

The flexible display technology releases the designs of display devices from being constrained to be planar and allows for diverse outside configurations and designs, and demonstrating the characteristics of being thin and light-weighted and impact resistant, making it fit to applications for various portable devices, such as mobile phones, personal digital assistants (PDAs), and notebook computers. Display devices of this kind is flexible and deformable and is more resistant to damage, allows for mounting to a curved surface, and can be manufactured as electronic newspapers, television walls, and wearable displays, those being desired by general consumers, demonstrating incredible charming of organic semiconductors.

In addition, another important factor associated with the development of the flexible display devices is that the manufacturing operations can be changed from sheet-fed batch processing to roll-to-roll manufacturing. This means the manufacturing costs of the display devices can be significantly reduced. Due to having the same thickness and flexibility as those of paper sheets, possessing the same message updatability as that of digital electronic media, being advantageous in respect of mechanical properties, and exhibiting a cost advantage for manufacturing, it is quite likely that the flexible display devices may take the position of flat panel displays that are currently dominating the market and gain certain business opportunity in an emerging market.

A thin-film transistor liquid crystal display (TFT-LCD) is a liquid crystal display having liquid crystal pixels each of which is driven by TFTs integrated on a backside thereof, where a scanning process is adopted to arbitrarily control the ON/OFF state of each of the displaying spots so as to display messages in a manner of high speed, high brightness, and high contrast. An active matrix organic light emitting diode (AMOLED) display is, similarly, driven by using TFTs with each pixel is provided with a TFT having a function of switching, and each pixel provided with a charge storage capacitor, where an entire system of a peripheral driving circuit and a display array is integrated on the same substrate. A difference from the TFT structure of TFT-LCD is that LCD is driven by an electric voltage, while an AMOLED is driven by an electric current so that brightness thereof is proportional to the electric current so that in addition to an addressing TFT that performs a switching operation between ON/OFF states, a small driving TFT that has a reduced ON state resistance to allow for the passage of a sufficiently large electric current is also needed. A static random access memory (SRAM) is similarly driven by using a TFT.

In a conventional manufacturing process for the TFTs of the flexible display devices, the operation temperatures, particularly the operation temperature of plasma enhanced chemical vapor deposition (PECVD), are generally relatively high, imposing a severe requirement for temperature of a substrate. The substrate of a TFT of a flexible display device is generally made of organic polymer materials, which are not resistant to high temperatures so as to hinder the progress of the flexible display technology.

SUMMARY OF THE INVENTION

An object of the present invention is to provide a thin-film transistor (TFT) substrate manufacturing method, of which the entire manufacturing process is conducted in room temperature, making it suitable for flexible display technology and requiring no temperature-resistant flexible substrate and also requiring no high temperature manufacturing facility such as expensive chemical vapor deposition, so as to greatly reduce the operation cost for manufacturing a flexible display device.

Another object of the present invention is to provide a TFT substrate, which shows excellent electrical characteristics and is suitable for a flexible display device.

To achieve the above objects, the present invention provides a TFT substrate manufacturing method, which comprises the following steps:

(1) providing a backing plate and depositing a first metal layer on the backing plate;

(2) coating a photoresist layer on the first metal layer and subjecting the photoresist layer to a patterning operation, such that a first photoresist pattern is solely preserved; using the first photoresist pattern as a shielding mask to subject the first metal layer to an anodic oxidization operation, such that a portion of the first metal layer that is not covered by the first photoresist pattern is oxidized and converted into a first metal oxide, and a portion of the first metal layer that is covered by the first photoresist pattern is not oxidized and remains metal;

(3) peeling the first photoresist pattern from the first metal layer and continuously subjecting the first metal layer to the anodic oxidization operation such that a metal surface that was covered by the first photoresist pattern is oxidized to form the first metal oxide and a portion of the metal that is located at an under side thereof and not oxidized forms a gate electrode, while the first metal oxide located on the gate electrode and the backing plate constitutes a gate insulation layer;

(4) depositing a metal oxide semiconductor material on the gate insulation layer and conducting a photolithographic operation to form an active layer;

(5) depositing a second metal layer on the active layer and the gate insulation layer;

(6) coating a photoresist layer on the second metal layer and subjecting the photoresist layer to a patterning operation, such that a second photoresist pattern is solely preserved; using the second photoresist pattern as a shielding mask to subject the second metal layer to an anodic oxidization operation, such that a portion of the second metal layer that is not covered by the second photoresist pattern is oxidized and converted into a second metal oxide, and a portion of the second metal layer that is covered by the second photoresist pattern is not oxidized and remains metal;

(7) peeling the second metal layer from the second photoresist pattern and continuously subjecting the second metal layer to the anodic oxidization operation such that a metal surface that was covered by the second photoresist pattern is oxidized to form the second metal oxide and a portion of the metal that is located at an under side thereof and not oxidized forms a source electrode and a drain electrode, while the second metal oxide located on the source electrode, the drain electrode, the active layer, and the gate insulation layer constitutes a passivation layer; and (8) applying a photolithographic operation to form a via in the passivation layer to correspond to the drain electrode and then depositing a transparent conductive film on the passivation layer; applying a photolithographic operation to subject the transparent conductive film to patterning to form a pixel electrode in such a way that the pixel electrode is connected, through the via, to the drain electrode.

The first metal layer and the second metal layer are formed of a material that comprises at least one of aluminum, magnesium, titanium, an aluminum alloy, a magnesium alloy, and a titanium alloy.

The metal oxide semiconductor material comprises one of $ZnO$, $In_2O_3$, and $SnO_2$ or a combination of multiple ones thereof.

The pixel electrode is formed of a material comprising indium tin oxide or indium zinc oxide.

Step (1) uses physical vapor deposition to deposit the first metal layer; step (4) uses physical vapor deposition to deposit the metal oxide semiconductor material; step (5) uses physical vapor deposition to deposit the second metal layer; and step (8) uses physical vapor deposition to deposit the transparent conductive film.

In steps (2), (3), (6), and (7), in the anodic oxidization operation, a corrosion-resistant conductive material is used as the cathode and a weak acid or weak base solution is used as the electrolyte solution.

In the anodic oxidization operation, graphite or platinum is used as the cathode and citric acid solution or ammonium tartrate solution is used as the electrolyte solution The present invention also provides a TFT substrate, which comprises: a backing plate, a gate electrode formed on the backing plate, a gate insulation layer formed on the gate electrode and the backing plate, an active layer formed on the gate insulation layer, a source electrode and a drain electrode formed on the active layer and the gate insulation layer, a passivation layer formed on the source electrode, the drain electrode, the active layer, and the gate insulation layer, and a pixel electrode formed on the passivation layer, wherein the gate insulation layer is formed of a material that is an oxide of a material that makes the gate electrode and the passivation layer is formed of a material that is an oxide of a material that makes the source electrode and the drain electrode.

The passivation layer comprises a via formed therein to correspond to the drain electrode and the pixel electrode is connected, through the via, to the drain electrode.

The gate electrode, the source electrode, and the drain electrode are formed of a material that comprises at least one of aluminum, magnesium, titanium, an aluminum alloy, a magnesium alloy, and a titanium alloy; the active layer is formed of a material comprising a metal oxide semiconductor material; the pixel electrode is formed of a material comprising indium tin oxide or indium zinc oxide.

The present invention further provides a TFT substrate manufacturing method, which comprises the following steps:

(1) providing a backing plate and depositing a first metal layer on the backing plate;

(2) coating a photoresist layer on the first metal layer and subjecting the photoresist layer to a patterning operation, such that a first photoresist pattern is solely preserved; using the first photoresist pattern as a shielding mask to subject the first metal layer to an anodic oxidization operation, such that a portion of the first metal layer that is not covered by the first photoresist pattern is oxidized and converted into a first metal oxide, and a portion of the first metal layer that is covered by the first photoresist pattern is not oxidized and remains metal;

(3) peeling the first photoresist pattern from the first metal layer and continuously subjecting the first metal layer to the anodic oxidization operation such that a metal surface that was covered by the first photoresist pattern is oxidized to form the first metal oxide and a portion of the metal that is located at an under side thereof and not oxidized forms a gate electrode, while the first metal oxide located on the gate electrode and the backing plate constitutes a gate insulation layer;

(4) depositing a metal oxide semiconductor material on the gate insulation layer and conducting a photolithographic operation to form an active layer;

(5) depositing a second metal layer on the active layer and the gate insulation layer;

(6) coating a photoresist layer on the second metal layer and subjecting the photoresist layer to a patterning operation, such that a second photoresist pattern is solely preserved; using the second photoresist pattern as a shielding mask to subject the second metal layer to an anodic oxidization operation, such that a portion of the second metal layer that is not covered by the second photoresist pattern is oxidized and converted into a second metal oxide, and a portion of the second metal layer that is covered by the second photoresist pattern is not oxidized and remains metal;

(7) peeling the second metal layer from the second photoresist pattern and continuously subjecting the second metal layer to the anodic oxidization operation such that a metal surface that was covered by the second photoresist pattern is oxidized to form the second metal oxide and a portion of the metal that is located at an under side thereof and not oxidized forms a source electrode and a drain electrode, while the second metal oxide located on the source electrode, the drain electrode, the active layer, and the gate insulation layer constitutes a passivation layer; and (8) applying a photolithographic operation to form a via in the passivation layer to correspond to the drain electrode and then depositing a transparent conductive film on the passivation layer; applying a photolithographic operation to subject the transparent conductive film to patterning to form a pixel electrode in such a way that the pixel electrode is connected, through the via, to the drain electrode;

wherein the first metal layer and the second metal layer are formed of a material that comprises at least one of aluminum, magnesium, titanium, an aluminum alloy, a magnesium alloy, and a titanium alloy;

wherein the metal oxide semiconductor material comprises one of $ZnO$, $In_2O_3$, and $SnO_2$ or a combination of multiple ones thereof; and wherein the pixel electrode is formed of a material comprising indium tin oxide or indium zinc oxide.

The efficacy of the present invention is that the present invention provides a TFT substrate manufacturing method and a TFT substrate manufactured with the method. The TFT substrate manufacturing method according to the present invention uses a photoresist pattern to serve as a shielding mask to allow a metal layer to be directly oxidized, through the anodic oxidation technology, into a gate insulation layer or a passivation layer, and at the same time, forming electrode patterns of gate or source/drain. The entire operation can be conducted in room temperature and is applicable to a flexible substrate that is not resistant to high temperatures without the involvement of expensive high temperature facility, such as chemical vapor deposition, so as to greatly reduce the operation cost of manufacturing a flexible display device. The TFT substrate manufactured with the present invention shows excellent electrical characteristics and is suitable for a flexible display device.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

The inventive idea of the present invention is to combine the manufacturing of metal oxide semiconductor (TOS) thin-film transistors (TFTs) with the anodic oxidation technology in order to propose a TFT substrate manufacturing method suitable for flexible displaying. The anodic oxidation technology involves techniques of electrochemical oxidation of metals or alloys. With the supply of a corresponding electrolyte liquid and operation conditions, metals and alloys thereof, when acted upon by an externally supplied electrical current, would undergo reactions where the anodic metal loses electrons so as to make the electrolyte solution dissociated and an oxidation reaction occurs to form an oxidation layer on a surface of the anodic metal. According to the time of oxidation of the anode, a film having a thickness of several nanometers to several micrometers may be formed.

Figure 1:
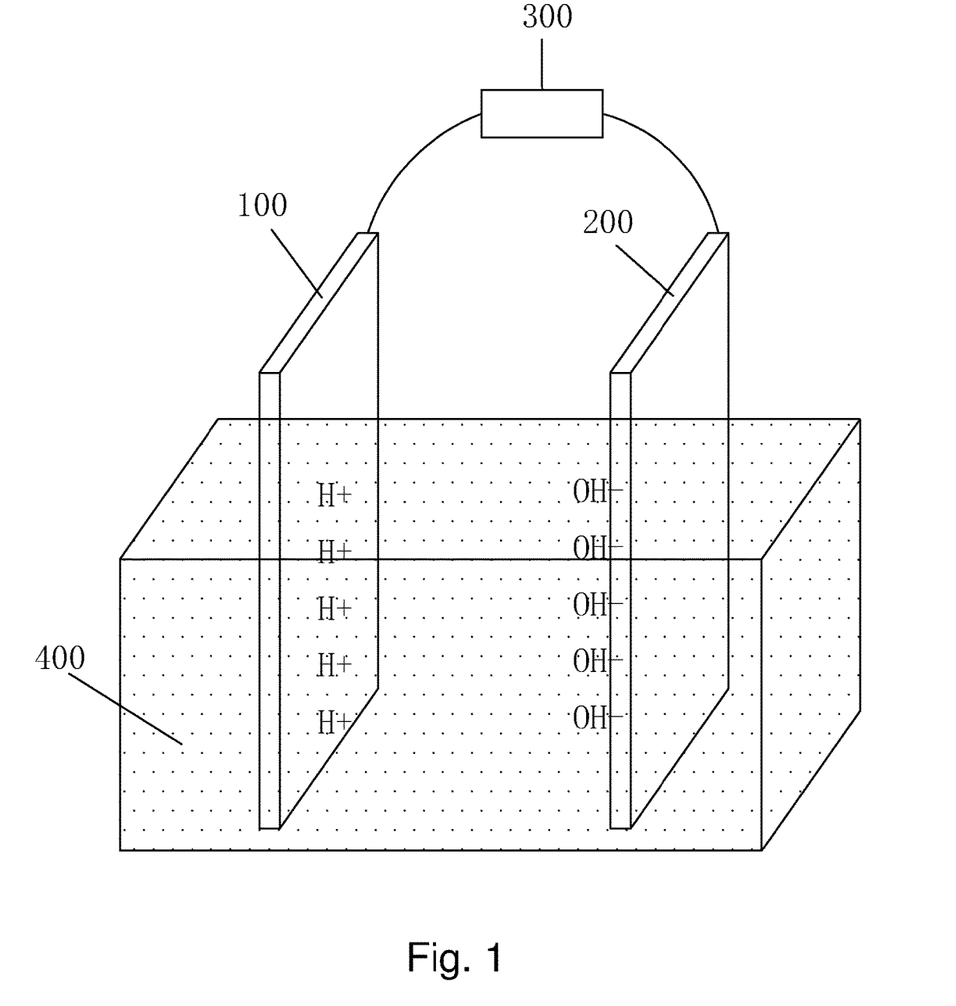
FIG. 1 is a schematic view illustrating an operation of anodic oxidation.

Referring to FIG. 1, a schematic view is given to illustrate an operation of anodic oxidation. As shown in FIG. 1, an anode 100 formed of metallic aluminum and a cathode 200 formed of graphite or metallic platinum are provided. After a constant voltage or constant current power source 300 is connected between the anode 100 and the cathode 200, the anode 100 and the cathode 200 are both dipped into an electrolyte solution 40. The electrolyte solution 400 can be a weak acid or weak base solution, such as citric acid solution and ammonium tartrate solution, whereby with electricity supplied to the anode 100 and the cathode 200, the anode 100 undergoes the electrochemical reaction: $2Al+3H_2O \rightarrow Al_2O_3+6e+6H^+$, and the cathode 200 undergoes the electrochemical reaction: $6H_2O+6e \rightarrow 3H_2+6OH^-$. As can be seen here, the reaction occurring on the anode 100 is a metal oxidation reaction.

Based on the above-described anodic oxidation technology, the present invention is designed to use a photoresist pattern to serve as a shielding mask to allow a metal layer to be directly oxidized, through the anodic oxidation technology, into a gate insulation layer or a passivation layer, and at the same time, forming electrode patterns of gate or source/drain. The entire operation can be conducted in room temperature and is applicable to a flexible substrate that is not resistant to high temperatures without the involvement of expensive high temperature facility, such as chemical vapor deposition, so as to greatly reduce the operation cost of manufacturing a flexible display device.

Figure 2:
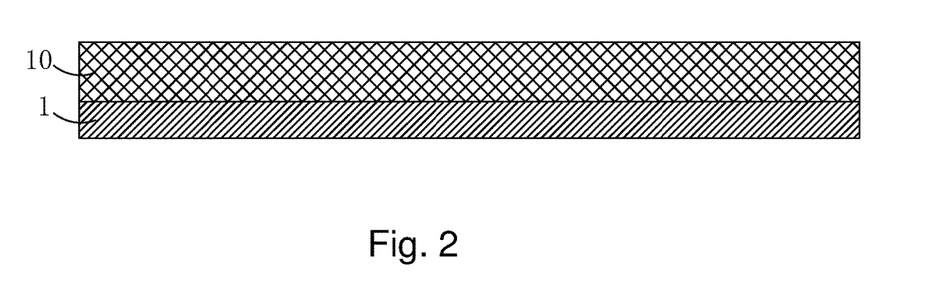
FIG. 2 is a schematic view illustrating step 1 of a thin-film transistor (TFT) substrate manufacturing method according to the present invention.

Referring to FIGS. 2-9, firstly, the present invention provides a thin-film transistor (TFT) substrate manufacturing method, which comprises the following steps:

Step 1: as shown in FIG. 2, providing a backing plate 1 and depositing a first metal layer 10 on the backing plate 1.

Specifically, the backing plate 1 can be a flexible plate or rigid plate. Further, the flexible plate can be a board made of an organic polymer material and the rigid plate can be a glass board.

Specifically, the first metal layer 10 is formed of a material comprising at least one of aluminum (Al), magnesium (Mg), titanium (Ti), an aluminum alloy, a magnesium alloy, and a titanium alloy.

Specifically, physical vapor deposition (PVD) is used to conduct the deposition of the first metal layer 10.

Figure 3:
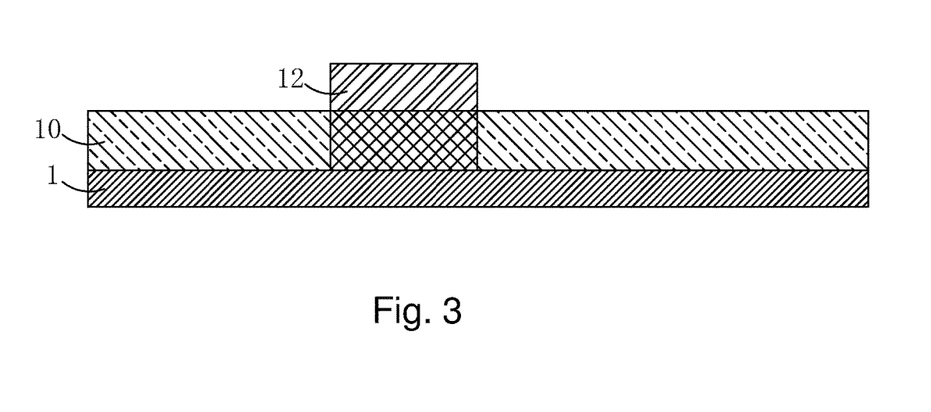
FIG. 3 is a schematic view illustrating step 2 of the TFT substrate manufacturing method according to the present invention.

Step 2: as shown in FIG. 3, coating a photoresist layer on the first metal layer 10 and subjecting the photoresist layer to a patterning operation, such that a first photoresist pattern 12 is solely preserved; using the first photoresist pattern 12 as a shielding mask to subject the first metal layer 10 to an anodic oxidization operation, such that a portion of the first metal layer 10 that is not covered by the first photoresist pattern 12 is oxidized and converted into a first metal oxide, and a portion of the first metal layer that is covered by the first photoresist pattern 12 is not oxidized and remains metal.

Figure 4:
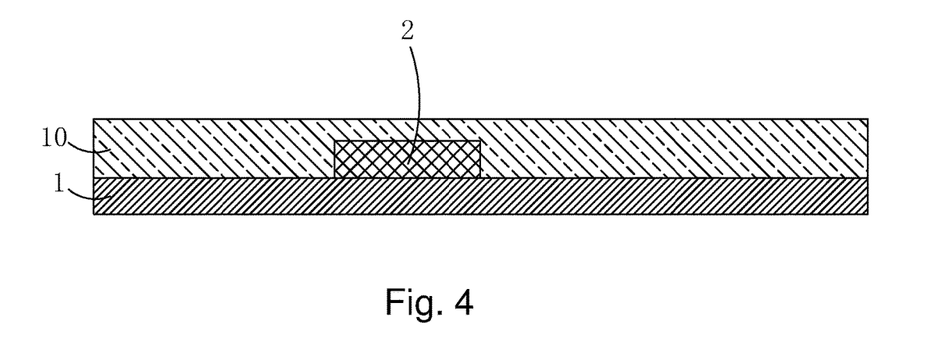
FIG. 4 is a schematic view illustrating step 3 of the TFT substrate manufacturing method according to the present invention.

Step 3: as shown in FIG. 4, peeling the first photoresist pattern 12 from the first metal layer 10 and continuously subjecting the first metal layer 10 to the anodic oxidization operation with oxidation time being controlled to have a metal surface that was covered by the first photoresist pattern 12 oxidized to form the first metal oxide, such that a portion of the metal that is located at an under side thereof and not oxidized forms a gate electrode 2, while the first metal oxide located on the gate electrode 2 and the backing plate 1 constitutes a gate insulation layer 3.

Figure 5:
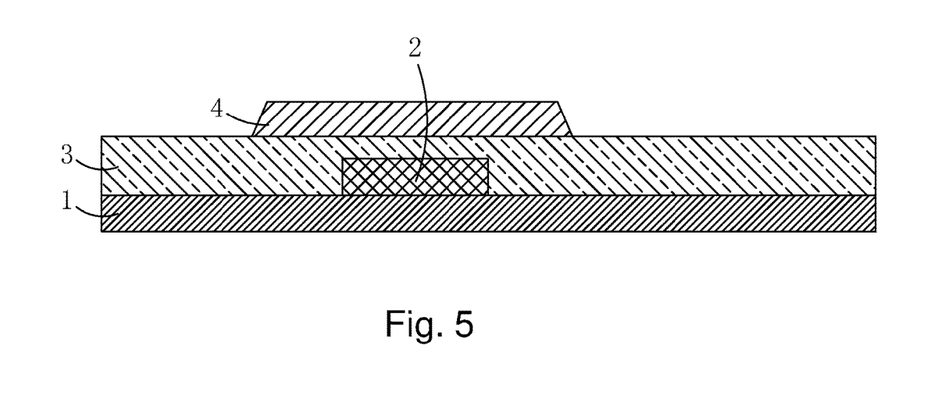
FIG. 5 is a schematic view illustrating step 4 of the TFT substrate manufacturing method according to the present invention.

Step 4: as shown in FIG. 5, depositing a metal oxide semiconductor material on the gate insulation layer 3 and conducting a photolithographic operation to form an active layer 4.

Preferably, the metal oxide semiconductor material comprises one of ZnO, $In_2O_3$, and $SnO_2$ or a combination of multiple ones thereof.

Specifically, physical vapor deposition is applied to conduct the deposition of the metal oxide semiconductor material.

Specifically, the photolithographic operation comprises operations of coating photoresist, exposure, development, and etching.

Figure 6:
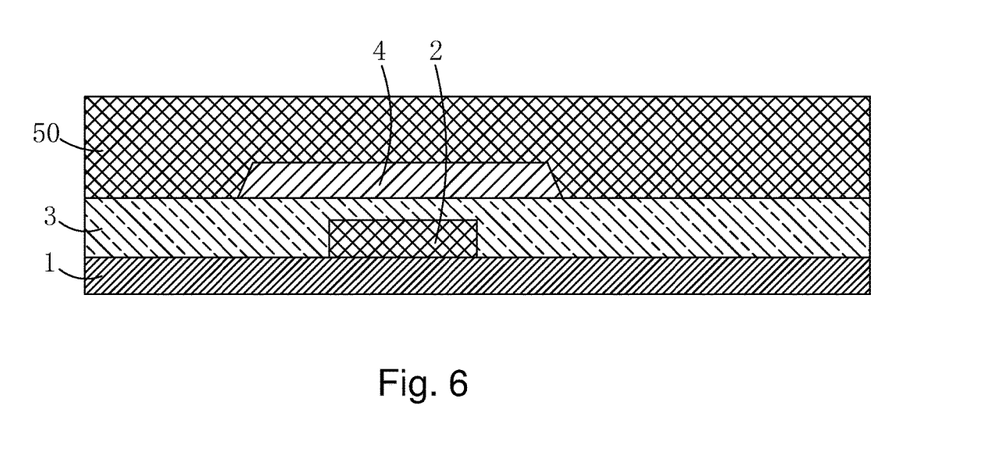
FIG. 6 is a schematic view illustrating step 5 of the TFT substrate manufacturing method according to the present invention.

Step 5: as shown in FIG. 6, depositing a second metal layer 50 on the active layer 4 and the gate insulation layer 3.

Specifically, the second metal layer 50 is formed of a material comprising at least one of aluminum (Al), magnesium (Mg), titanium (Ti), an aluminum alloy, a magnesium alloy, and a titanium alloy.

Specifically, physical vapor deposition is used to conduct the deposition of the second metal layer 50.

Figure 7:
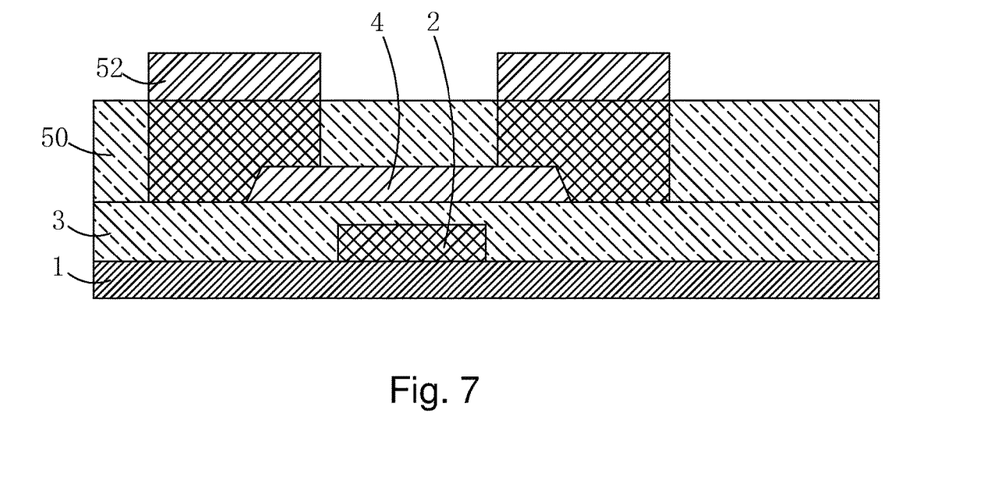
FIG. 7 is a schematic view illustrating step 6 of the TFT substrate manufacturing method according to the present invention.

Step 6: as shown in FIG. 7, coating a photoresist layer on the second metal layer 50 and subjecting the photoresist layer to a patterning operation, such that a second photoresist pattern 52 is solely preserved; using the second photoresist pattern 52 as a shielding mask to subject the second metal layer 50 to an anodic oxidization operation, such that a portion of the second metal layer 50 that is not covered by the second photoresist pattern 52 is oxidized and converted into a second metal oxide, and a portion of the second metal layer that is covered by the second photoresist pattern 52 is not oxidized and remains metal.

Figure 8:
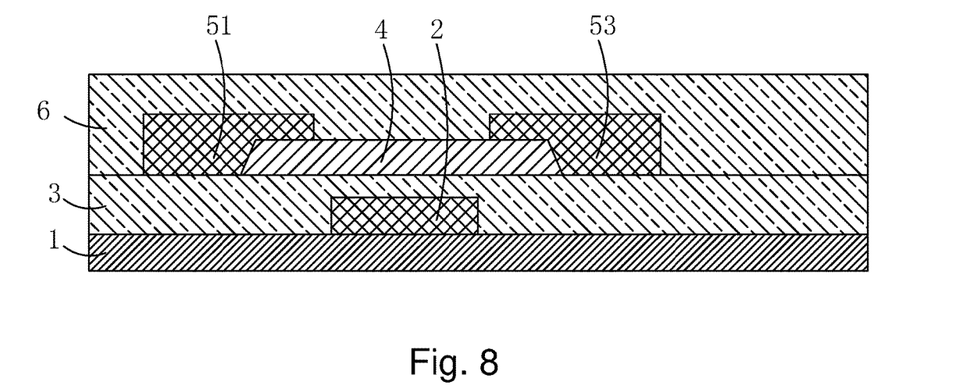
FIG. 8 is a schematic view illustrating step 7 of the TFT substrate manufacturing method according to the present invention.

Step 7: as shown in FIG. 8, peeling the second metal layer 50 from the second photoresist pattern 52 and continuously subjecting the second metal layer 50 to the anodic oxidization operation with oxidation time being controlled to have a metal surface that was covered by the second photoresist pattern 52 oxidized to form the second metal oxide, such that a portion of the metal that is located at an under side thereof and not oxidized forms a source electrode 51 and a drain electrode 53, while the second metal oxide located on the source electrode 51, the drain electrode 53, the active layer 4, and the gate insulation layer 3 constitutes a passivation layer 6.

Specifically, in Step 2, Step 3, Step 6, and Step 7, in the anodic oxidization operation, a corrosion-resistant conductive material, such as graphite or platinum, is used as the cathode 100; and a weak acid or weak base solution, such as citric acid solution and ammonium tartrate solution, is used as the electrolyte solution 400.

Figure 9:
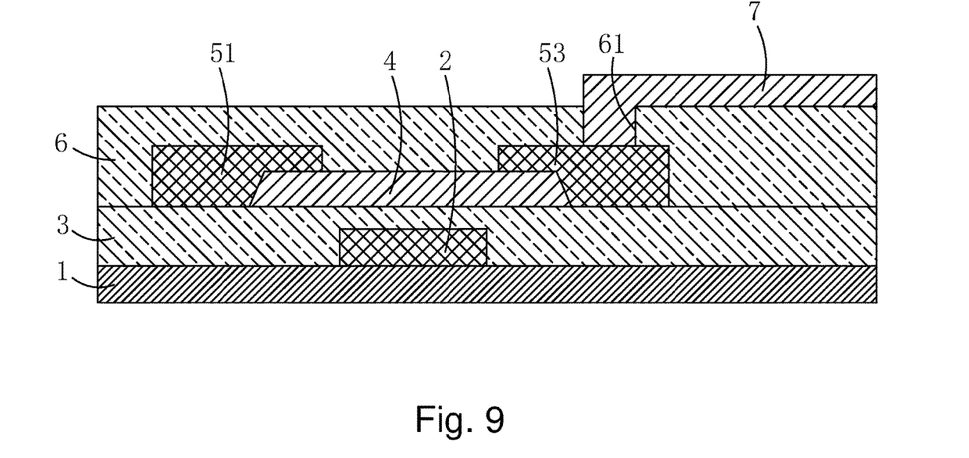
FIG. 9 is a schematic view illustrating step 8 of the TFT substrate manufacturing method according to the present invention and is also a schematic view illustrating a structure of a TFT substrate according to the present invention.

Step 8: as shown in FIG. 9, applying a photolithographic operation to form a via 61 in the passivation layer 6 to correspond to the drain electrode 53 and then depositing a transparent conductive film on the passivation layer 6; applying a photolithographic operation to subject the transparent conductive film to patterning to form a pixel electrode 7 in such a way that the pixel electrode 7 is connected, through the via 61, to the drain electrode 53.

Specifically, the pixel electrode 7 is formed of a material comprising a transparent conductive material, such as ITO (indium tin oxide) and IZO (indium zinc oxide).

Specifically, physical vapor deposition is used to conduct the deposition of the transparent conductive film.

In the above-described TFT substrate manufacturing method, a photoresist pattern is used to serve as a shielding mask to allow a metal layer to be directly oxidized, through the anodic oxidation technology, into a gate insulation layer or a passivation layer, and at the same time, forming electrode patterns of gate or source/drain. The entire operation can be conducted in room temperature and is applicable to a flexible substrate that is not resistant to high temperatures without the involvement of expensive high temperature facility, such as chemical vapor deposition, so as to greatly reduce the operation cost of manufacturing a flexible display device.

Referring to FIG. 9, the present invention also provides a TFT substrate, which comprises: a backing plate 1, a gate electrode 2 formed on the backing plate 1, a gate insulation layer 3 formed on the gate electrode 2 and the backing plate 1, an active layer 4 formed on the gate insulation layer 3, a source electrode 51 and a drain electrode 53 formed on the active layer 4 and the gate insulation layer 3, a passivation layer 6 formed on the source electrode 51, the drain electrode 53, the active layer 4, and the gate insulation layer 3, and a pixel electrode 7 formed on the passivation layer 6, wherein the gate insulation layer 3 is formed of a material that is an oxide of a material that makes the gate electrode 2 and the passivation layer 6 is formed of a material that is an oxide of a material that makes the source electrode 51 and the drain electrode 53.

Specifically, the passivation layer 6 comprises a via 61 formed therein to correspond to the drain electrode 53 and the pixel electrode 7 is connected, through the via 61, to the drain electrode 53.

Specifically, the backing plate 1 can be a flexible plate or rigid plate. Further, the flexible plate can be a board made of an organic polymer material and the rigid plate can be a glass board.

Specifically, the gate electrode 2 is formed of a material comprising at least one of aluminum (Al), magnesium (Mg), titanium (Ti), an aluminum alloy, a magnesium alloy, and a titanium alloy.

The active layer 4 is formed of a material comprising a metal oxide semiconductor material, and preferably, the metal oxide semiconductor material comprises one of ZnO, $In_2O_3$, and $SnO_2$ or a combination of multiple ones thereof.

The source electrode 51 and the drain electrode 53 are formed of a material comprising at least one of aluminum (Al), magnesium (Mg), titanium (Ti), an aluminum alloy, a magnesium alloy, and a titanium alloy.

Specifically, the pixel electrode 7 is formed of a material comprising a transparent conductive material, such as ITO (indium tin oxide) and IZO (indium zinc oxide).

In summary, the present invention provides a TFT substrate manufacturing method and a TFT substrate manufactured with the method. The TFT substrate manufacturing method according to the present invention uses a photoresist pattern to serve as a shielding mask to allow a metal layer to be directly oxidized, through the anodic oxidation technology, into a gate insulation layer or a passivation layer, and at the same time, forming electrode patterns of gate or source/drain. The entire operation can be conducted in room temperature and is applicable to a flexible substrate that is not resistant to high temperatures without the involvement of expensive high temperature facility, such as chemical vapor deposition, so as to greatly reduce the operation cost of manufacturing a flexible display device. The TFT substrate manufactured with the present invention shows excellent electrical characteristics and is suitable for a flexible display device.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A thin-film transistor (TFT) substrate, comprising: a backing plate, a gate electrode formed on the backing plate, a gate insulation layer formed on the gate electrode and the backing plate, an active layer formed on the gate insulation layer, a source electrode and a drain electrode formed on the active layer and the gate insulation layer, a passivation layer formed on the source electrode, the drain electrode, the active layer, and the gate insulation layer, and a pixel electrode formed on the passivation layer;
    wherein the gate insulation layer is formed of a material that is an oxide of a material that makes the gate electrode, the oxide being formed by oxidizing the material that makes the gate electrode;
    wherein the passivation layer is formed of a material that is an oxide of a metallic material that makes the source electrode and the drain electrode.

2. The TFT substrate as claimed in claim 1, wherein the oxide of the material that makes the gate electrode is formed with an anodic oxidization operation.

3. The TFT substrate as claimed in claim 1, wherein the material that makes the gate electrode comprises a metallic material that comprises at least one of aluminum, magnesium, titanium, an aluminum alloy, a magnesium alloy, and a titanium alloy.

4. The TFT substrate as claimed in claim 3, wherein the metallic material of the gate electrode is arranged on the backing plate and partially oxidized to form an oxide that forms the gate insulation layer and completely covers and encloses a part of the metallic material that is not oxidized and forms the gate electrode.

5. The TFT substrate as claimed in claim 1, wherein the active layer is formed of a metal oxide semiconductor material that is arranged on the gate insulation layer.

6. The TFT substrate as claimed in claim 5, wherein the metal oxide semiconductor material that makes the active layer comprises one of ZnO, $In_2O_3$, and $SnO_2$ or a combination of multiple ones thereof.

7. The TFT substrate as claimed in claim 1, wherein the metallic material that makes the source electrode and the drain electrode comprises at least one of aluminum, magnesium, titanium, an aluminum alloy, a magnesium alloy, and a titanium alloy.

8. The TFT substrate as claimed in claim 1, wherein the oxide of the metallic material that makes the source electrode and the drain electrode is formed with an anodic oxidization operation.

9. The TFT substrate as claimed in claim 1, wherein the passivation layer comprises a via formed therein to correspond to the drain electrode and the pixel electrode is connected, through the via, to the drain electrode.

10. The TFT substrate as claimed in claim 1, wherein the pixel electrode is formed of a material comprising indium tin oxide or indium zinc oxide.

11. A thin-film transistor (TFT) substrate, comprising: a backing plate, a gate electrode formed on the backing plate, a gate insulation layer formed on the gate electrode and the backing plate, an active layer formed on the gate insulation layer, a source electrode and a drain electrode formed on the active layer and the gate insulation layer, a passivation layer formed on the source electrode, the drain electrode, the active layer, and the gate insulation layer, and a pixel electrode formed on the passivation layer;
    wherein the gate insulation layer is formed of a material that is an oxide of a material that makes the gate electrode, the oxide being formed by oxidizing the material that makes the gate electrode;
    wherein the material that makes the gate electrode comprises a metallic material that comprises at least one of aluminum, magnesium, titanium, an aluminum alloy, a magnesium alloy, and a titanium alloy; and
    wherein a metallic material that makes the source electrode and the drain electrode is arranged on the active layer and the gate insulation layer and partially oxidized to form an oxide that forms the passivation layer, such that parts of the metallic material are not oxidized and remains metallic to respectively form the source electrode and the drain electrode.

12. The TFT substrate as claimed in claim 11, wherein the oxide of the material that makes the gate electrode is formed with an anodic oxidization operation.

13. The TFT substrate as claimed in claim 12, wherein the metallic material of the gate electrode is arranged on the backing plate and partially oxidized to form an oxide that forms the gate insulation layer and completely covers and encloses a part of the metallic material that is not oxidized and forms the gate electrode.

14. The TFT substrate as claimed in claim 11, wherein the active layer is formed of a metal oxide semiconductor material that is arranged on the gate insulation layer.

15. The TFT substrate as claimed in claim 14, wherein the metal oxide semiconductor material that makes the active layer comprises one of ZnO, $In_2O_3$, and $SnO_2$ or a combination of multiple ones thereof.

16. The TFT substrate as claimed in claim 11, wherein the metallic material that makes the source electrode and the drain electrode comprises at least one of aluminum, magnesium, titanium, an aluminum alloy, a magnesium alloy, and a titanium alloy.

17. The TFT substrate as claimed in claim 11, wherein the oxide of the metallic material that makes the source electrode and the drain electrode is formed with an anodic oxidization operation.

18. The TFT substrate as claimed in claim 11, wherein the passivation layer comprises a via formed therein to correspond to the drain electrode and the pixel electrode is connected, through the via, to the drain electrode.

19. The TFT substrate as claimed in claim 11, wherein the pixel electrode is formed of a material comprising indium tin oxide or indium zinc oxide.

* * * * *